United States Patent
Imada et al.

(10) Patent No.: US 8,765,554 B2
(45) Date of Patent: Jul. 1, 2014

(54) COMPOUND SEMICONDUCTOR DEVICE AND METHOD FOR MANUFACTURING THE SAME

(75) Inventors: Tadahiro Imada, Kawasaki (JP); Toshihide Kikkawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 320 days.

(21) Appl. No.: 13/325,972

(22) Filed: Dec. 14, 2011

(65) Prior Publication Data
US 2012/0220089 A1  Aug. 30, 2012

(30) Foreign Application Priority Data
Feb. 25, 2011  (JP) .................................. 2011-039921

(51) Int. Cl.
*H01L 21/336* (2006.01)

(52) U.S. Cl.
USPC ........... 438/270; 438/167; 438/172; 438/176; 438/183; 438/273; 257/E21.41

(58) Field of Classification Search
USPC ......................................... 438/183, 273, 274
See application file for complete search history.

(56) References Cited

U.S. PATENT DOCUMENTS

| | | | |
|---|---|---|---|
| 2008/0315257 A1* | 12/2008 | Shiraishi ........................ | 257/195 |
| 2010/0155720 A1 | 6/2010 | Kaneko | |
| 2010/0155780 A1 | 6/2010 | Machida et al. | |
| 2010/0330754 A1* | 12/2010 | Hebert ........................... | 438/172 |
| 2012/0217546 A1 | 8/2012 | Machida et al. | |

FOREIGN PATENT DOCUMENTS

| | | |
|---|---|---|
| CN | 101789445 | 7/2010 |
| JP | 2008-071988 A | 3/2008 |
| JP | 2009-049288 A | 3/2009 |
| JP | 2010-153493 A | 7/2010 |

OTHER PUBLICATIONS

Office Action of Chinese Patent Application No. 201110452379.6 dated Mar. 4, 2014 with English-language Summary.

* cited by examiner

*Primary Examiner* — Angel Roman

(74) *Attorney, Agent, or Firm* — Fujitsu Patent Center

(57) ABSTRACT

A gate electrode is formed so as to embed an electrode material in a recess for an electrode, which has been formed in a structure of stacked compound semiconductors, through a gate insulation film, and also a field plate electrode that comes in Schottky contact with the structure of the stacked compound semiconductors is formed by embedding an electrode material in a recess for an electrode, which has been formed in the structure of the stacked compound semiconductors so that the field plate electrode directly comes in contact with the structure of the stacked compound semiconductors at least on the bottom face of the recess for the electrode.

18 Claims, 10 Drawing Sheets

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2011-039921, filed on Feb. 25, 2011, the entire contents of which are incorporated herein by reference.

FIELD

The present embodiments relate to a compound semiconductor device and a method for manufacturing the same.

BACKGROUND

Application of a nitride semiconductor to a semiconductor device with high-voltage resistance and high output, by using the features of the nitride semiconductor, which has a high saturation electron speed, a wide band gap and the like, is being investigated. For instance, a band gap of GaN, which is a nitride semiconductor, is 3.4 eV, which is larger than a band gap (1.1 eV) of Si and a band gap (1.4 eV) of GaAs, and accordingly GaN has high breakdown field strength. For this reason, GaN is very promising as a material for a semiconductor device for a power supply for obtaining high-voltage operation and high output.

As for the semiconductor device using the nitride semiconductor, there have been a large number of reports on field effect transistors, and particularly high electron mobility transistors (High Electron Mobility Transistor: HEMT). For instance, in a GaN-based HEMT (GaN-HEMT), an AlGaN/GaN-HEMT which uses GaN as an electron transit layer and AlGaN as an electron supply layer has received attention. In the AlGaN/GaN-HEMT, distortion occurs in AlGaN, which originates in the difference between the lattice constants of GaN and AlGaN. A high concentration of two-dimensional electron gas (2D EG) is obtained due to the piezo polarization generated by the distortion and the spontaneous polarization of AlGaN. For this reason, the nitride semiconductor is expected to be a highly efficient switching element and a high-voltage resistant power device for electric vehicles and the like.

Patent Literature 1: Japanese Laid-open Patent Publication No. 2010-153493

Patent Literature 2: Japanese Laid-open Patent Publication No. 2009-49288

Patent Literature 3: Japanese Laid-open Patent Publication No. 2008-71988

However, the GaN-HEMT generally has defects of having no avalanche resistance and being considerably weak at a surge. In addition, the GaN-HEMT does not have a body diode therein, which is different from a Si-based semiconductor device, and needs to have a diode connected to the outside as a so-called free wheel diode (FWD), in order to be applied to an inverter circuit (full-bridge inverter circuit) or the like, for instance. In addition, the GaN-HEMT has a large ratio Cgd/Cgs of a parasitic capacity Cgd between a gate electrode and a drain electrode to a parasitic capacity Cgs between the gate electrode and a source electrode, in comparison with the Si-based semiconductor device, and there is a concern that the operation tends to be unstable.

SUMMARY

One embodiment of the compound semiconductor device includes: a structure of stacked compound semiconductors, in which a first recess and a second recess are formed; a gate electrode formed in the first recess through a gate insulation film; and a field plate electrode which is formed in the second recess and comes in Schottky contact with the structure of the stacked compound semiconductors.

One embodiment of a method for manufacturing the compound semiconductor device includes: forming a first recess in a surface layer in a structure of stacked compound semiconductors; forming a gate insulation film in the first recess; forming a second recess in a surface layer of the structure of the stacked compound semiconductors; forming a gate electrode in the first recess through the gate insulation film; and forming a field plate electrode which comes in Schottky contact with the structure of the stacked compound semiconductors in the second recess.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

Embodiments will be described in detail below with reference to the drawings. In the following embodiments, the structure of a compound semiconductor device will be described together with a method for manufacturing the same.

In the following drawings, there is a component of which the relatively exact size and thickness are not depicted for the convenience of illustration.

First Embodiment

In the present embodiment, an MIS type of AlGaN/GaN-HEMT is disclosed as a compound semiconductor device.

FIG. 1A to FIG. 3C are schematic sectional views illustrating a method for manufacturing the MIS type of AlGaN/GaN-HEMT according to the first embodiment, in order of the steps.

Figure 1A:
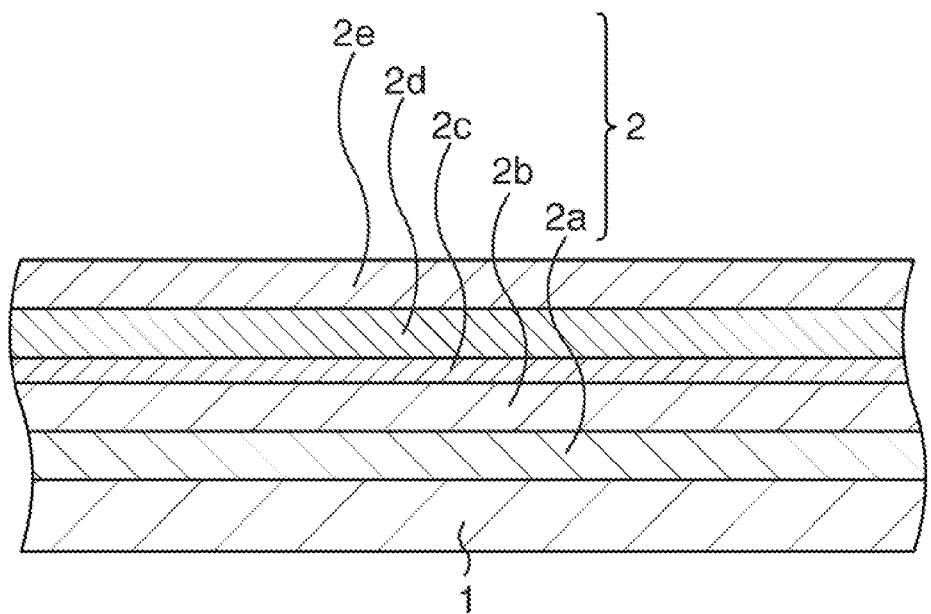
FIGS. 1A to 1C are schematic sectional views illustrating a method for manufacturing an MIS type of AlGaN/GaN-HEMT according to the first embodiment in order of the steps.

Firstly, as is illustrated in FIG. 1A, a structure 2 of stacked compound semiconductors is formed, for instance, on a Si substrate 1 which is a substrate for growing semiconductors thereon. In place of the Si substrate, a sapphire substrate, a GaAs substrate, a GaN substrate or the like may also be used as the substrate for growing the semiconductors thereon. As for the electroconductivity of the substrate, the substrate may have any of semi-insulating properties and electroconductivity.

The structure 2 of the stacked compound semiconductors is constituted by a buffer layer 2a, an electron transit layer 2b, an intermediate layer 2c, an electron supply layer 2d and a cap layer 2e.

In the completed AlGaN/GaN-HEMT, during the operation, a two-dimensional electron gas (2DEG) is generated in the vicinity of the interface between the electron transit layer 2b and the electron supply layer 2d (to be precise, intermediate layer 2c). This 2DEG is generated based on the difference between the lattice constants of a compound semiconductor (here, GaN) of the electron transit layer 2b and a compound semiconductor (here, AlGaN) of the electron supply layer 2d.

As for the detail, each of the following compound semiconductors is grown on the Si substrate 1, for instance, with a metal organic vapor phase epitaxy (MOVPE: Metal Organic Vapor Phase Epitaxy) method. In place of the MOVPE method, a molecular beam epitaxy (MBE: Molecular Beam Epitaxy) method or the like may also be used.

On the Si substrate 1, AlN with a thickness of approximately 0.1 μm, i (intentionally undoped)-GaN with a thickness of approximately 3 μm, i-AlGaN with a thickness of approximately 5 nm, an n-AlGaN with a thickness of approximately 30 nm and an n-GaN with a thickness of approximately 10 nm are sequentially grown. Thereby, the buffer layer 2a, the electron transit layer 2b, the intermediate layer 2c, the electron supply layer 2d and the cap layer 2e are formed.

As for the growing conditions of the AlN, the GaN, the AlGaN and the GaN, a mixture gas of trimethyl aluminum gas, trimethyl gallium gas and ammonia gas is used as the raw material gas. The presence or absence of the supply of trimethyl aluminum gas which is a source of aluminum and trimethyl gallium gas which is a source of Ga and the flow rate of each gas are appropriately set according to the type of growing compound semiconductor layers. The flow rate of the ammonia gas which is a common raw material is set at approximately 100 ccm to 10 LM. The growth pressure is set at approximately 50 Torr to 300 Torr, and the growth temperature is set at approximately 1,000° C. to 1,200° C.

When the GaN and the AlGaN are grown as an n type, SiH$_4$ gas, for instance, containing Si, for instance, as n-type impurities is added to the raw material gas at a predetermined flow rate to dope the GaN and the AlGaN with Si. The doping concentration by Si is set in the range of $1 \times 10^{18}/cm^3$ to $1 \times 10^{20}/cm^3$, and approximately at $5 \times 10^{18}/cm^3$, for instance.

Figure 1B:
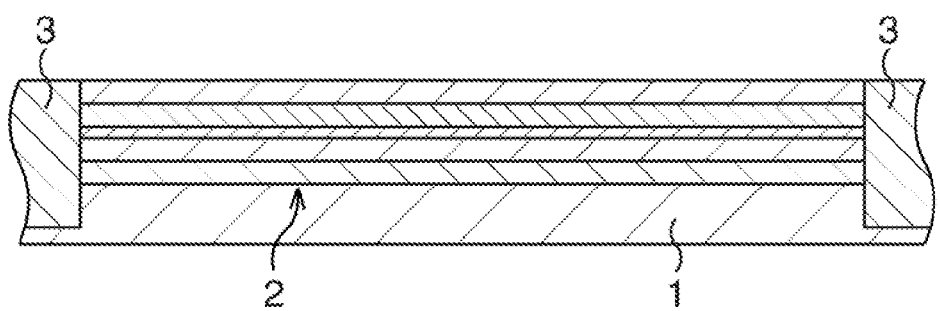

Subsequently, an element isolation structure 3 is formed as is illustrated in FIG. 1B. In subsequent figures after FIG. 2A, the illustration for the element isolation structure 3 will be omitted.

As for the detail, argon (Ar), for instance, is injected into the element isolation region of the structure 2 of the stacked compound semiconductors. Thereby, the element isolation structure 3 is formed in the structure 2 of the stacked compound semiconductors and in the surface layer portion of the Si substrate 1. The element isolation structure 3 demarcates an active region on the structure 2 of the stacked compound semiconductors.

In addition, the element may also be isolated, for instance, with an STI (Shallow Trench Isolation) method, in place of the above described injection method. At this time, a chlorine-based etching gas, for instance, is used for dry-etching the structure 2 of the stacked compound semiconductors.

Figure 1C:
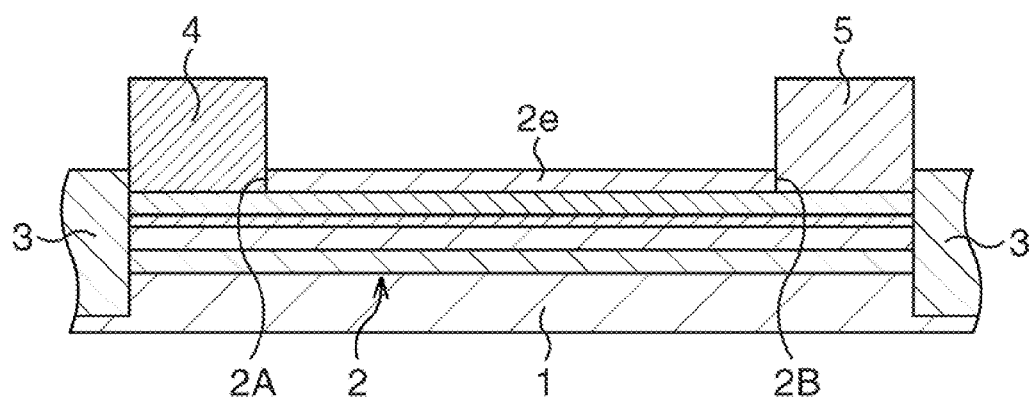

Subsequently, a source electrode 4 and a drain electrode 5 are formed as is illustrated in FIG. 1C.

As for the detail, firstly, recesses 2A and 2B for electrodes are formed at respective positions on the surface of the structure 2 of the stacked compound semiconductors, at which the source electrode and the drain electrode are scheduled to be formed (positions of electrodes scheduled to be formed therein).

A resist is applied onto the surface of the structure 2 of the stacked compound semiconductors. The resist is processed with lithography so as to have an aperture formed in the resist, which exposes the surface of the structure 2 of the stacked compound semiconductors at the position corresponding to a position of the electrode scheduled to be formed therein, to the outside. By the above described operations, a resist mask having the aperture therein is formed.

The cap layer 2e at a position corresponding to the position of the electrode scheduled to be formed therein is removed by dry etching with the use of the resist mask, until the surface of the electron supply layer 2d is exposed to the outside. Thereby, the recesses 2A and 2B for the electrodes are formed, which expose the surfaces of the electron supply layer 2d to the outside at the positions of the electrodes scheduled to be formed therein. As for the etching conditions, an inert gas such as Ar and a chlorine-based gas such as Cl$_2$ are used as an etching gas, the flow rate of Cl$_2$ is set at 30 sccm, the pressure is set at 2 Pa and the RF electric power to be charged is set at 20 W, for instance. In addition, the recesses 2A and 2B for the electrodes may be formed by being etched down to the middle of the cap layer 2e, or may also be formed by being etched down to the electron supply layer 2d or deeper.

The resist mask is removed by asking treatment or the like.

A resist mask for use in forming the source electrode and the drain electrode is formed. Here, for instance, a two-layer resist with an eave structure is used, which is suitable for a vapor deposition method and a lift-off method. This resist is applied onto the structure 2 of the stacked compound semiconductors, and apertures are formed which expose the recesses 2A and 2B for electrodes to the outside. By the above described operations, the resist mask having the apertures therein is formed.

By using this resist mask, Ta/Al, for instance, is deposited on the resist mask including the inside of the apertures for exposing the recesses 2A and 2B for electrodes to the outside, as an electrode material with a vapor deposition method, for instance. The thickness of Ta is set at approximately 20 nm, and the thickness of Al is set at approximately 200 nm. The resist mask and Ta/Al having deposited on the resist mask are removed with a lift-off method. Subsequently, the Si substrate 1 is heated, for instance, in a nitrogen atmosphere, and at a temperature between 400° C. and 1,000° C., for instance, at approximately 600° C. Thereby, the Ta/Al which has remained there is brought into ohmic contact with the electron supply layer $2d$. If the Ta/Al can be brought in ohmic contact with the electron supply layer $2d$, there is also the case in which the heat treatment is unnecessary. By the above described operations, the source electrode 4 and the drain electrode 5 are formed which embeds the respective parts of the electrode material in the recesses 2A and 2B for electrodes.

Figure 2A:
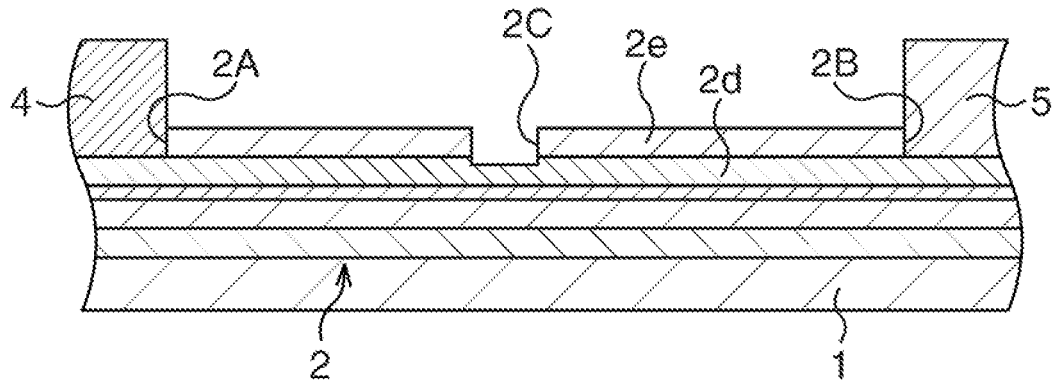
FIGS. 2A to 2C are schematic sectional views which illustrate a method for manufacturing the MIS type of AlGaN/GaN-HEMT according to the first embodiment in order of the steps, and follows FIGS. 1A to 1C.

Subsequently, the recess 2C for the electrode of the gate electrode is formed in the structure 2 of the stacked compound semiconductors, as is illustrated in FIG. 2A.

As for the detail, firstly, a resist is applied onto the surface of the structure 2 of the stacked compound semiconductors. The resist is processed with lithography so as to have an aperture formed in the resist, which exposes the surface of the structure 2 of the stacked compound semiconductors at the position corresponding to a position of a gate electrode scheduled to be formed therein (position of electrode scheduled to be formed therein), to the outside. By the above described operations, the resist mask having the aperture therein is formed.

The cap layer $2e$ and a part of the electron supply layer $2d$ at the position of the electrode scheduled to be formed therein are removed by dry etching with the use of the resist mask. Thereby, the recess 2C for the electrode is formed, in which the cap layer $2e$ and even a part of the electron supply layer $2d$ are dug. As for the etching conditions, an inert gas such as Ar and a chlorine-based gas such as $Cl_2$ are used as an etching gas, the flow rate of $Cl_2$ is set at 30 sccm, the pressure is set at 2 Pa and the RF electric power to be charged is set at 20 W, for instance. In addition, the recess 2C for the electrode may be formed by being etched down to the middle of the cap layer $2e$, and may also be formed by being etched down to a deeper portion of the electron supply layer $2d$. The resist mask is removed with asking treatment or the like.

Figure 2B:
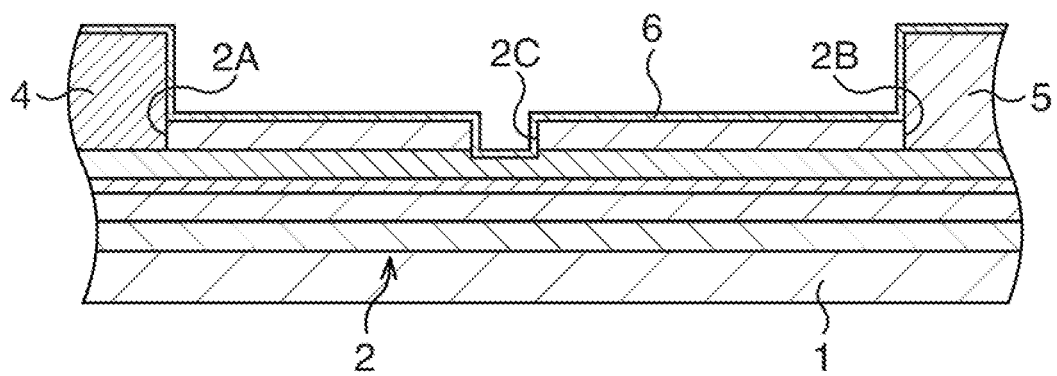

Subsequently, a gate insulation film 6 is formed as is illustrated in FIG. 2B.

As for the detail, $Al_2O_3$, for instance, is deposited as an insulation material on the structure 2 of the stacked compound semiconductors so as to cover the inner wall face of the recess 2C for the electrode. The $Al_2O_3$ is deposited, for instance, with an atomic layer deposition method (Atomic Layer Deposition: ALD method) so as to form the film with a thickness of 2 nm to approximately 200 nm, and approximately 10 nm, here. Thereby, the gate insulation film 6 is formed.

The $Al_2O_3$ may be deposited, for instance, also with a plasma CVD method, a sputtering method or the like, in place of the ALD method. In addition, a nitride or oxynitride of Al may also be used in place of the deposition of $Al_2O_3$. As for the use of other compounds than the above, the gate insulation film may also be formed by depositing an oxide, nitride or oxynitride of Si, Hf, Zr, Ti, Ta and W, or by depositing any compounds appropriately selected from the above compounds to form a multilayer.

Figure 2C:
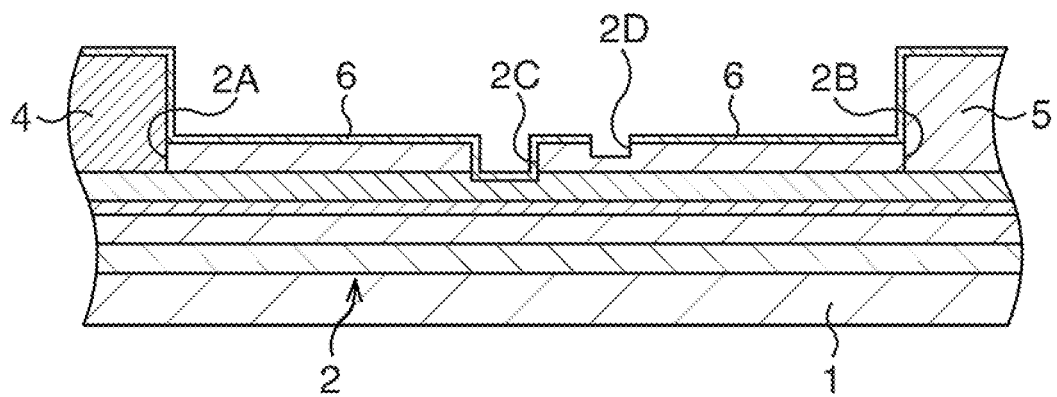

Subsequently, the recess 2D for the electrode of the field plate electrode is formed in the structure 2 of the stacked compound semiconductors, as is illustrated in FIG. 2C.

As for the detail, firstly, a resist is applied onto the gate insulation film 6. The resist is processed with lithography so as to have an aperture formed in the resist, which exposes the surface of the gate insulation film 6 to the outside at the position corresponding to a position of the field plate electrode scheduled to be formed therein (position of electrode scheduled to be formed therein). By the above described operations, a resist mask having the aperture therein is formed. In addition, the position of the electrode scheduled to be formed therein shall be a predetermined portion between the recess 2C for the electrode of the gate electrode and the drain electrode 5.

The gate insulation film 6 and a part of the cap layer $2e$ at the position of the electrode scheduled to be formed therein is removed by dry etching with the use of the resist mask. Thereby, the recess 2D for the electrode is formed, in which even a part of the cap layer $2e$ is also dug. The recess 2D for the electrode is formed so that the longitudinal direction becomes parallel to the longitudinal direction of the recess 2C for the electrode. As for the etching conditions, in order to etch the gate insulation film 6, an aqueous alkaline solution such as a KOH solution and a TMAH solution is used as an etchant, and KOH solution is used, for instance. In order to etch the cap layer $2e$, an inert gas such as Ar and a chlorine-based gas such as $Cl_2$ are used as an etching gas, the flow rate of $Cl_2$ is set at 30 sccm, the pressure is set at 2 Pa and the RF electric power to be charged is set at 20 W, for instance.

The resist mask is removed by asking treatment or the like.

In the present embodiment, the recess 2D for the electrode of the field plate electrode is formed so as to be shallower than the recess 2C for the electrode of the gate electrode, when viewed with respect to the surface of the structure 2 of stacked compound semiconductors (surface of cap layer $2e$). It is considered that the cap layer $2e$ is formed by etching until the surface of the electron supply layer $2d$ is exposed to the outside or is formed also by etching down to a deeper portion of the electron supply layer $2d$, under such restriction that the recess 2D for the electrode is shallower than the recess 2C for the electrode.

Figure 3A:
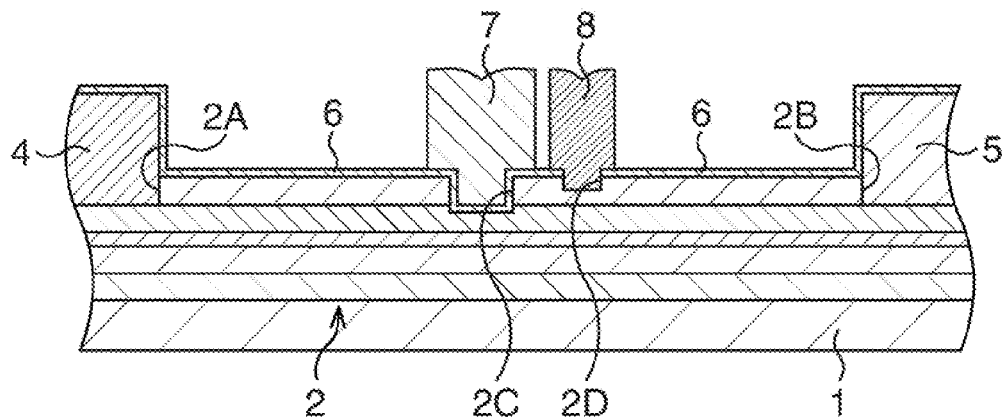
FIGS. 3A to 3C are schematic sectional views which illustrate a method for manufacturing the MIS type of AlGaN/GaN-HEMT according to the first embodiment in order of the steps, and follows FIGS. 2A to 2C.

Subsequently, the gate electrode 7 and the field plate electrode 8 are formed as is illustrated in FIG. 3A.

As for the detail, firstly, a resist mask for use in forming the gate electrode and the field plate electrode is formed. Here, for instance, a two-layer resist with an eave structure is used, which is suitable for a vapor deposition method and a lift-off method. This resist is applied onto the gate insulation film 6, and respective apertures are formed which expose the portion of the recess 2C for the electrode of the gate insulation film 6 and the recess 2D for the electrode to the outside. By the above described operations, a resist mask having the apertures therein is formed.

By using this resist mask, Ni/Au, for instance, is deposited on the resist mask including the inside of the aperture which exposes the portion of the recess 2C for the electrode of the gate insulation film 6 and the inside of the aperture which exposes the recess 2D for the electrode, as an electrode material with a vapor deposition method, for instance. The thickness of Ni is set at approximately 30 nm, and the thickness of Au is set at approximately 400 nm. The resist mask and Ni/Au having deposited on the resist mask are removed with a lift-off method. By the above described operations, the gate electrode 7 is formed which embeds the part of the electrode material in the recess 2C for the electrode through the gate insulation film 6. At the same time, the field plate electrode 8 is formed which embeds the part of the electrode material in the recess 2D for the electrode. The field plate electrode 8 directly comes in contact (Schottky contact) with the cap layer $2e$ of the structure 2 of the stacked compound semiconductors, on a part of the side face in the recess 2D for the electrode and on the bottom face of the recess 2D for the electrode.

In the present embodiment, the case has been illustrated in which the gate electrode 7 and the field plate electrode 8 are simultaneously formed, but the electrodes may also be individually formed (so that the gate electrode 7 is formed and then the field plate electrode 8 is formed, for instance). In this case, the gate electrode 7 and the field plate electrode 8 can have different thicknesses of the Ni and the Au between the electrodes, or can also be formed from different electrode materials from each other.

Figure 3B:
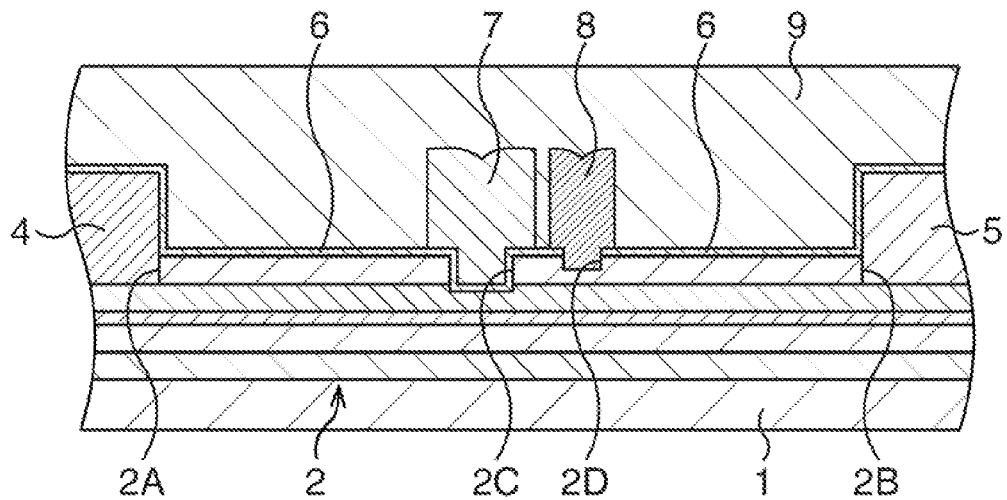

Subsequently, the interlayer insulation film 9 is formed as is illustrated in FIG. 3B.

As for the detail, an insulating material, for instance, SiN is deposited on the whole surface of the Si substrate 1 with a CVD method or the like so as to cover the source electrode 4, the drain electrode 5, the gate electrode 7 and the field plate electrode 8. Thereby, the interlayer insulation film 9 is formed.

Figure 3C:
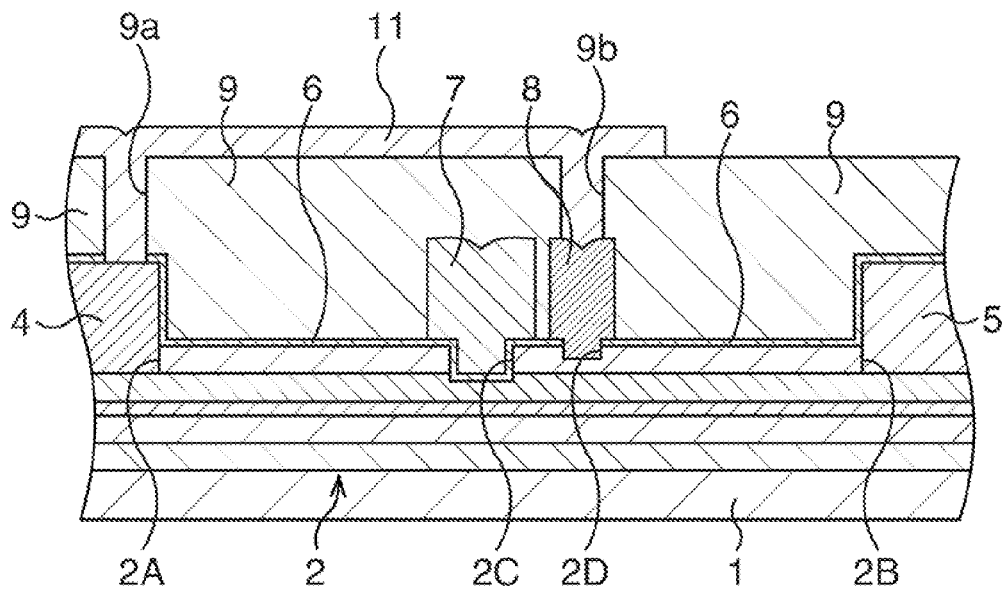

Subsequently, a wiring layer 11 is formed as is illustrated in FIG. 3C.

As for the detail, firstly, the interlayer insulation film 9 and the gate insulation film 6 are processed with lithography and dry etching. Thereby, apertures 9a and 9b are formed which expose each one part of respective surfaces of the source electrode 4 and the field plate electrode 8, to the outside.

An electroconductive material, for instance, Au, is deposited on the interlayer insulation film 9 with a vapor deposition method or the like so as to be embedded in the apertures 9a and 9b.

The deposited Au is processed with lithography and dry etching. By the above described operations, the wiring layer 11 is formed on the interlayer insulation film 9, which is formed from the electroconductive material embedded in the apertures 9a and 9b and electrically connects the source electrode 4 to the field plate electrode 8.

In the present embodiment, the case has been illustrated in which the source electrode 4 is electrically connected to the field plate electrode 8, but the case is also considered in which the gate electrode 7 is electrically connected to the field plate electrode 8. In the latter case, it is considered to integrally form both of the gate electrode 7 and the field plate electrode 8 instead of separately forming both of the electrodes on the gate insulation film 6, for instance, in the step of forming both of the electrodes, instead of forming the wiring layer in the above described way.

After that, the MIS type of the AlGaN/GaN-HEMT according to the present embodiment is formed through the steps of forming a protection film of the upper layer and the like.

In the MIS type of the AlGaN/GaN-HEMT according to the present embodiment, the gate electrode 7 is formed so as to be embedded in the recess 2C for the electrode through the gate insulation film 6. By adopting this MIS type of the recess gate structure as a premise, the AlGaN/GaN-HEMT enables a high-voltage resistant normally-off operation which is desired for a HEMT.

In the present embodiment, the field plate electrode 8 which is embedded in the recess 2D for the electrode is provided so as to be adjacent to the drain electrode 5 side of the gate electrode 7. Because of this, an electric field applied to the edge site of the gate electrode 7 is sufficiently alleviated, and the withstand voltage is greatly enhanced.

The field plate electrode 8 comes in Schottky contact with the structure 2 of the stacked compound semiconductors (here, cap layer 2e). In this structure, the gate insulation film 6 does not exist under the field plate electrode 8. Because of this, the field plate electrode 8 sufficiently and surely acts against 2DEG, the parasitic capacity Cgd decreases and the Cgd/Cgs decreases, which contributes to the increase of the speed of the device operation.

Here, when the recess 2D for the electrode is deepened and the field plate electrode 8 excessively approaches the 2DEG, there is a concern that the ON resistance increases. In the present embodiment, the recess 2D for the electrode is made shallower than the recess 2C for the electrode of the gate electrode 7, and the distance between the field plate electrode 8 and the 2DEG is appropriately kept. Thereby, the above described concern is wiped out, and the influence due to the increase of the ON resistance is eliminated.

Figure 4:
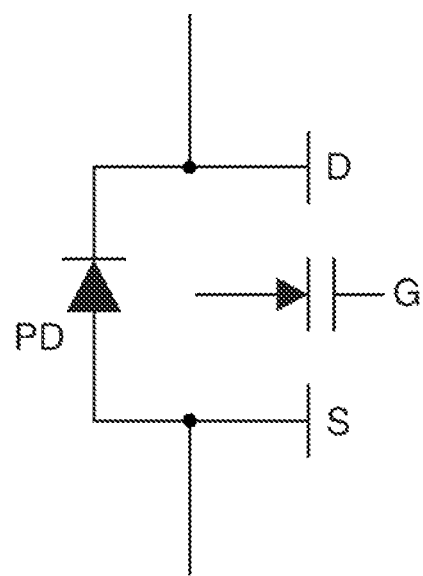
FIG. 4 is a view illustrating symbols in an equivalent circuit of the MIS type of AlGaN/GaN-HEMT according to the first embodiment.

Furthermore, in the present embodiment, such a field plate electrode 8 is adopted as to come in Schottky contact with the structure 2 of the stacked compound semiconductors, and thereby a function of a protection diode is imparted in which the field plate electrode 8 works as an anode and the drain electrode 5 works as a cathode. The symbols in an equivalent circuit of this AlGaN/GaN-HEMT are illustrated in FIG. 4. The gate electrode, the source electrode and the drain electrode are marked as G, S and D, and the protective diode is marked as PD. Even when a surge voltage has occurred in the AlGaN/GaN-HEMT, a rectifying action of the PD suppresses a fracture of the AlGaN/GaN-HEMT. Thus, avalanche resistance is sufficiently secured, which contributes to the stabilization of the device operation.

As was described above, the compound semiconductor device according to the present embodiment has the field plate electrode 8 provided therein which comes in Schottky contact with the structure of the stacked compound semiconductors in the recess 2D for the electrode, while keeping the MIS type of a recess gate structure. By this structure, a highly-reliable and high-voltage resistant AlGaN/GaN-HEMT is realized which enables an adequate normally-off operation, alleviates the convergence of an electric field toward the gate electrode 7 to further enhance the withstand voltage, besides, has the high avalanche resistance, does not need to have an external diode connected thereto, and can obtain a surely stable operation.

Modified Example

A modified example of the MIS type of AlGaN/GaN-HEMT according to the first embodiment will be described below.

In the present example, the MIS type of AlGaN/GaN-HEMT is disclosed which is similar to that in the first embodiment, but is different in the point that a cap layer of the structure of the stacked compound semiconductors is different. In addition, the same components as those in the first embodiment are denoted by the same reference numerals, and the detailed description will be omitted.

FIG. 5 is a schematic sectional view illustrating principal steps in a method for manufacturing the MIS type of AlGaN/GaN-HEMT according to the modified example of the first embodiment.

Figure 5A:
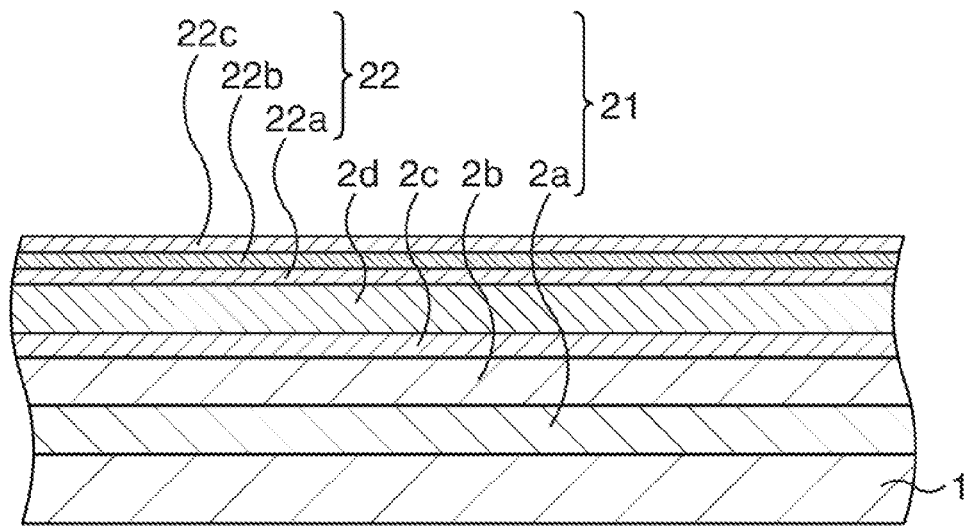
FIGS. 5A to 5C are schematic sectional views illustrating principal steps in a method for manufacturing the MIS type of AlGaN/GaN-HEMT according to a modified example of the first embodiment.

Firstly, as is illustrated in FIG. 5A, a structure 21 of stacked compound semiconductors is formed, for instance, on a Si substrate 1 which is a substrate for growing semiconductors thereon.

The structure 21 of the stacked compound semiconductors is constituted by a buffer layer 2a, an electron transit layer 2b, an intermediate layer 2c, an electron supply layer 2d and a cap layer 22.

The cap layer 22 has a stacked structure including a layer made from a compound semiconductor which has a narrower band gap than a compound semiconductor in the lower layer thereof (here, n-AlGaN of electron supply layer 2d), and a layer made from a compound semiconductor which has a wider band gap than the compound semiconductor in the lower layer. Here, n-GaN is exemplified as a former layer, AlN is exemplified as a latter layer, and the cap layer 22 is formed of three layers of the compound semiconductor layers, in which n-GaN 22a, AlN 22b and n-GaN 22c are sequentially stacked.

In addition, as for the cap layer having this stacked structure, it is also considered to give, for instance, a two-layer structure in which n-GaN and AlN are sequentially stacked or a stacked structure of four or more layers, to the cap layer, other than the above described case.

The buffer layer 2a, the electron transit layer 2b, the intermediate layer 2c, the electron supply layer 2d and the cap layer 22 are sequentially grown and formed on the same growing conditions as those in the first embodiment, with an MOVPE method. In the cap layer 22, the n-GaN 22a is formed so as to have a film thickness of approximately 2 nm to 3 nm, the AlN 22b is formed so as to have a film thickness of approximately 2 nm to 3 nm and the n-GaN 22c is formed so as to have a film thickness of approximately 5 nm, respectively.

Subsequently, the same steps as in FIG. 1B to FIG. 2B in the first embodiment are conducted.

At this time, the source electrode 4 and the drain electrode 5 are formed respectively on the recesses 21A and 21B for the electrodes of the structure 21 of the stacked compound semiconductors, and the gate insulation film 6 is formed on the structure 21 of the stacked compound semiconductors so as to cover the inner wall face of the recess 21C for the electrode.

Figure 5B:
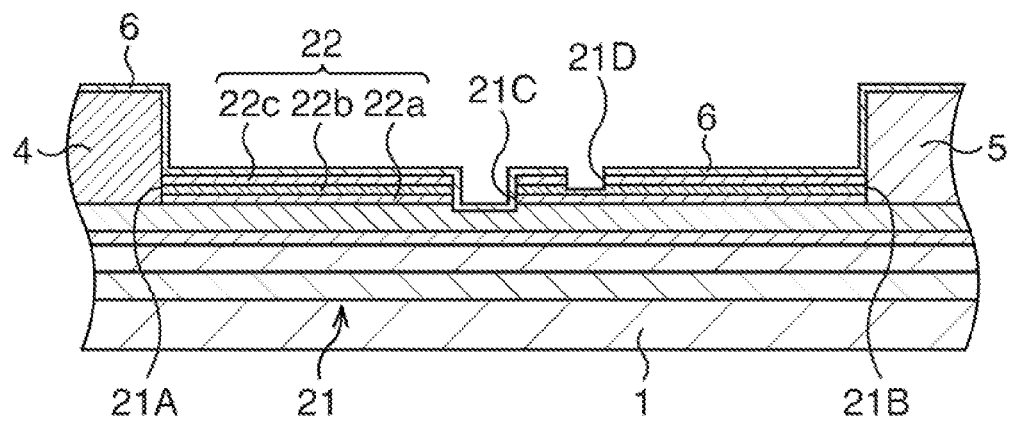

Subsequently, a recess 21D for the electrode of the field plate electrode is formed on the structure 21 of the stacked compound semiconductors as is illustrated in FIG. 5B.

As for the detail, firstly, a resist is applied onto the gate insulation film 6. The resist is processed with lithography so as to have an aperture formed in the resist, which exposes the surface of the gate insulation film 6 to the outside at the position corresponding to a position of the field plate electrode scheduled to be formed therein (position of electrode scheduled to be formed therein). By the above described operations, a resist mask having the aperture therein is formed. In addition, the position of the electrode scheduled to be formed therein shall be a predetermined portion between the recess 21C for the electrode of the gate electrode and the drain electrode 5.

The gate insulation film 6 and a part of the cap layer 22 at the position of the electrode scheduled to be formed therein is removed by dry etching with the use of the resist mask. In the present example, AlN is etched on an etching condition of a lower etching rate than that of GaN, by using the difference of the etching rate between the GaN and the AlN. Specifically, the AlN 22b out of the cap layer 22 is used as an etching stopper, and the n-GaN 22a is dry-etched. Thereby, the recess 21D for the electrode is formed which exposes the AlN 22b of the cap layer 2e to the outside. However, it is assumed that a part of the surface layer of the AlN 22b is also actually etched, and accordingly the recess 21D for the electrode is illustrated on the assumption that even a part of the AlN 22b is also dug.

As for the etching conditions, in order to etch the gate insulation film 6, an aqueous alkaline solution such as a KOH solution and a TMAH solution is used as an etchant, and KOH solution is used, for instance. In order to etch the n-GaN 22a of the cap layer 2e, an inert gas such as Ar and a chlorine-based gas such as $Cl_2$ are used as an etching gas, the flow rate of $Cl_2$ is set at 30 sccm, the pressure is set at 2 Pa and the RF electric power to be charged is set at 20 W, for instance The resist mask is removed by asking treatment or the like.

In the present embodiment, the recess 21D for the electrode of the field plate electrode needs to be formed so as to be shallower than the recess 21C for the electrode of the gate electrode, when viewed with respect to the surface of the structure 21 of the stacked compound semiconductors (surface of cap layer 22). The recess 21D for the electrode can be formed so as to have a predetermined depth which is shallower than the recess 21C for the electrode of the gate electrode and has been nearly accurately specified by the film thickness of the AlN 22b, by etching the AlN 22b of the cap layer 22 as an etching stopper under the restriction of this depth.

In addition, it is also considered that the recess 21D for the electrode is formed by etching the cap layer 22 until the surface of the electron supply layer 2d is exposed to the outside or is formed by etching the cap layer 22 down to a deeper portion of the electron supply layer 2d, under such restriction that the recess 21D for the electrode is shallower than the recess 21C for the electrode.

Subsequently, the gate electrode 7 which embeds the part of Ni/Au in the recess 2C for the electrode, and the field plate electrode 8 which embeds the part of the Ni/Au in the recess 21D for the electrode are simultaneously formed by conducting the same step as in FIG. 3A in the first embodiment.

Figure 5C:
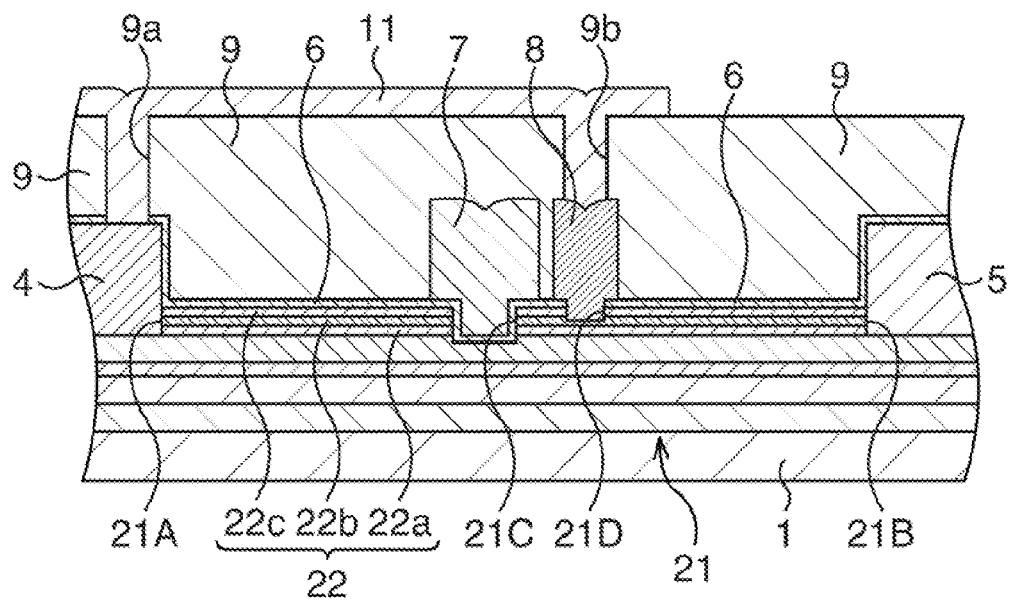

Subsequently, the source electrode 4 is electrically connected to the field plate electrode 8 with a wiring layer 11 by conducting the same steps as in FIG. 3B to FIG. 3C in the first embodiment. The state at this time is illustrated in FIG. 5C.

After that, the MIS type of the AlGaN/GaN-HEMT according to the present example is formed through the steps of forming the protection film of the upper layer and the like.

As was described above, the compound semiconductor device according to the present example has the field plate electrode 8 provided therein which comes in Schottky contact with the structure of the stacked compound semiconductors in the recess 21D for the electrode, while keeping the MIS type of a recess gate structure. By this structure, a highly-reliable and high-voltage resistant AlGaN/GaN-HEMT is realized which enables an adequate normally-off operation, alleviates the convergence of an electric field toward the gate electrode 7 to further enhance the withstand voltage, besides, has the high avalanche resistance, does not need to have an external diode connected thereto, and can obtain a surely stable operation.

Figure 6:
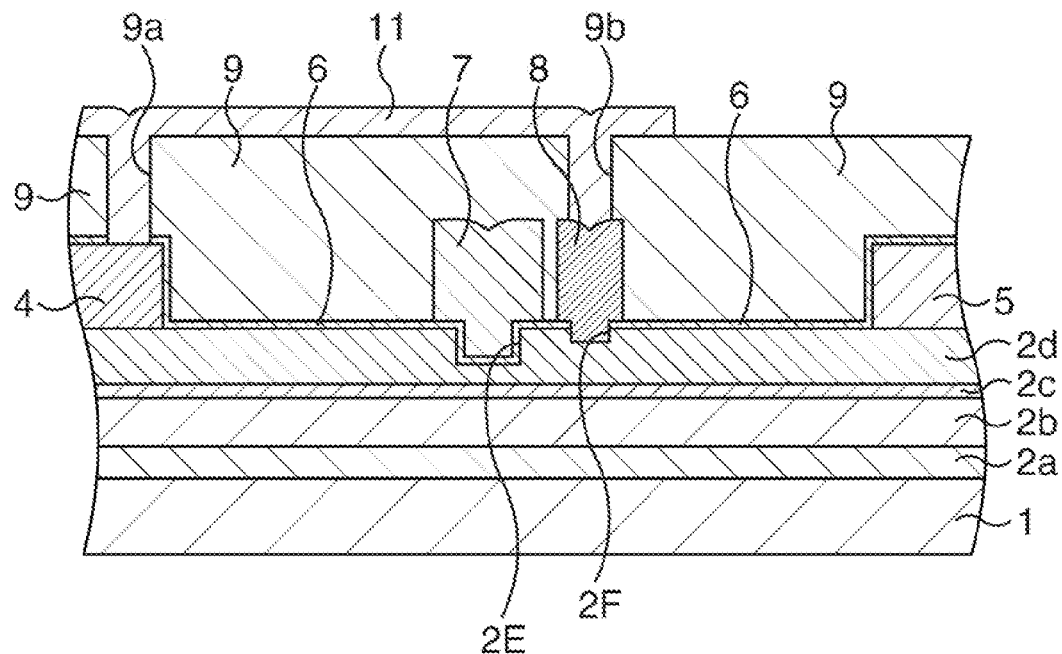
FIG. 6 is a sectional view illustrating a schematic structure of the MIS type of AlGaN/GaN-HEMT according to another application example of the first embodiment.

In addition, it is also considered not to form the cap layer 2e on the structure 2 of the stacked compound semiconductors, as another application example of the first embodiment. This AlGaN/GaN-HEMT is illustrated in FIG. 6. In FIG. 6, the illustration for the element isolation structure 3 will be omitted.

The recess 2E for the electrode of the gate electrode 7 and the recess 2F for the electrode of the field plate electrode 8 are both formed by being dug down to the middle of the electron supply layer 2d with dry etching. In this case, the recess 2F for the electrode is formed so as to be shallower than the recess 2E for the electrode, when viewed with respect to the surface of the structure 2 of the stacked compound semiconductors (surface of electron supply layer 2d).

In this application example as well, a highly-reliable and high-voltage resistant AlGaN/GaN-HEMT is realized which enables an adequate normally-off operation, alleviates the convergence of an electric field toward the gate electrode 7 to further enhance the withstand voltage, besides, has the high avalanche resistance, does not need to have the external diode connected thereto, and can obtain the surely stable operation.

The above described AlGaN/GaN-HEMT according to the first embodiment and the modified example is applied to a so-called discrete package.

On this discrete package, the chip of the above described AlGaN/GaN-HEMT is mounted. The discrete package of the chip of the AlGaN/GaN-HEMT (hereinafter referred to as HEMT chip) according to the first embodiment and the modified example will be exemplified below.

Figure 7:
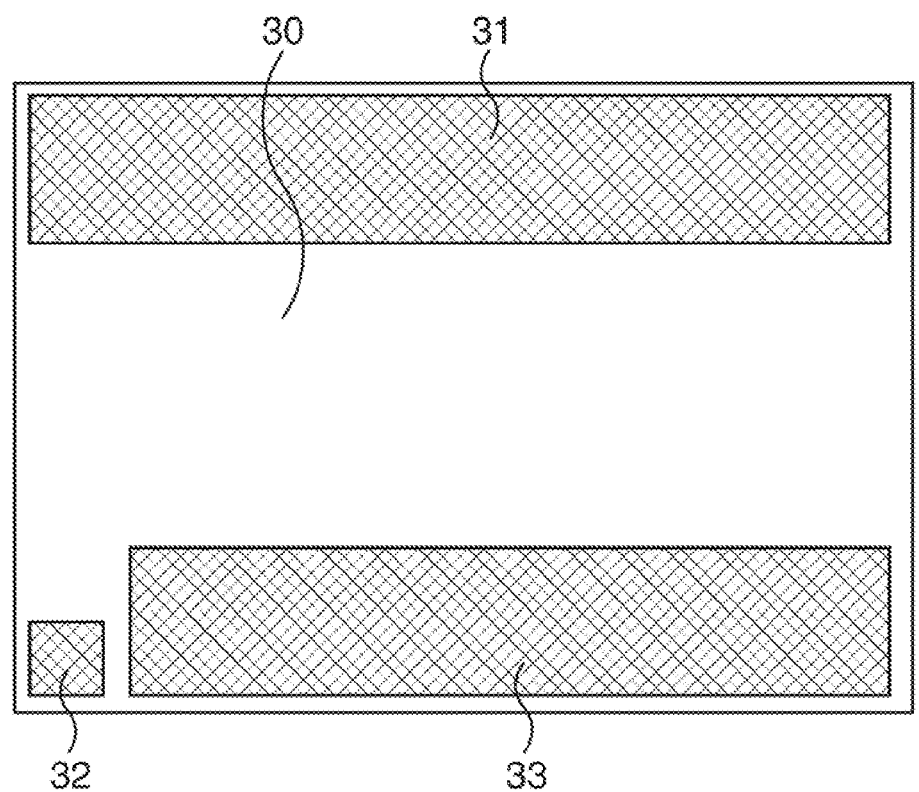
FIG. 7 is a plan view illustrating a schematic structure of the MIS type of AlGaN/GaN-HEMT chip according to the first embodiment.

The schematic structure of the HEMT chip is illustrated in FIG. 7.

The HEMT chip 30 has a drain pad 31 to which the drain electrode of the above described AlGaN/GaN-HEMT is connected, a gate pad 32 to which the gate electrode is connected, and a source pad 33 to which the source electrode is connected so as to be provided on its surface.

Figure 8:
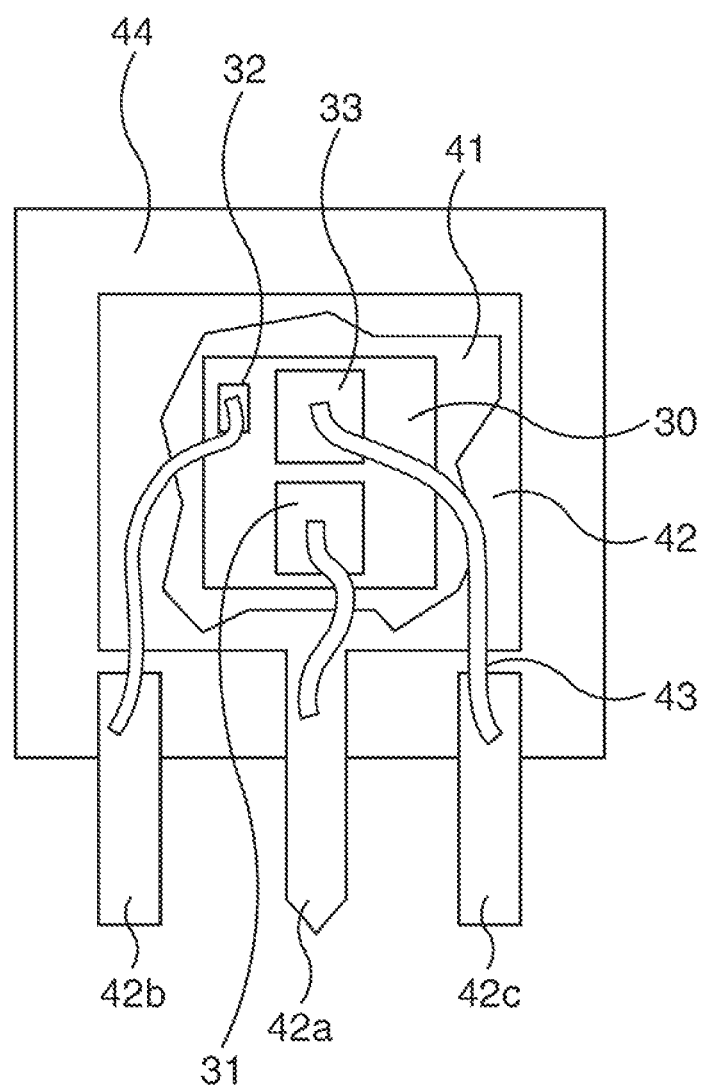
FIG. 8 is a plan view illustrating a schematic structure of a discrete package using the HEMT chip according to the first embodiment.

FIG. 8 is a schematic plan view illustrating the discrete package.

In order to prepare the discrete package, firstly, the HEMT chip 30 is fixed to a lead frame 42 with a die attachment agent 41 such as solder. In the lead frame 42, a drain lead 42a is integrally formed, and the gate lead 42b and the source lead 42c are arranged separately from the lead frame 42 while being separated from each other.

Subsequently, the drain pad 31 is electrically connected to the drain lead 42a, the gate pad 32 is electrically connected to the gate lead 42b, and the source pad 33 is electrically connected to the source lead 42c with a bonding method using an Al wire 43.

After that, the HEMT chip 30 is sealed by using a mold resin 44 with a transfer mold method, and the lead frame 42 is separated. By the above operations, the discrete package is formed.

Second Embodiment

In the present embodiment, a PFC (Power Factor Correction) circuit is disclosed which is provided with an AlGaN/GaN-HEMT selected from the first embodiment and the modified example thereof.

Figure 9:
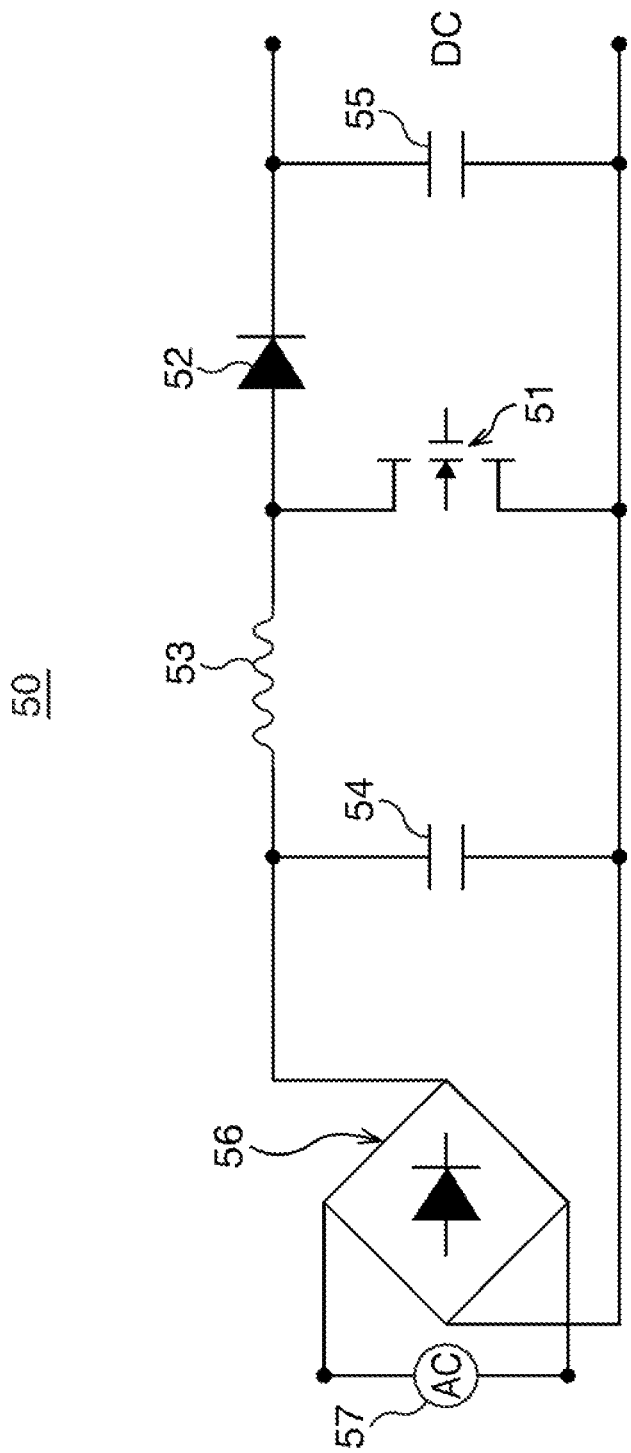
FIG. 9 is a connection wiring diagram illustrating a PFC circuit according to the second embodiment.

FIG. 9 is a connection wiring diagram illustrating the PFC circuit.

The PFC circuit 50 is constituted by a switching element (transistor) 51, a diode 52, a choke coil 53, capacitors 54 and 55, a diode bridge 56 and an AC power supply (AC) 57. The AlGaN/GaN-HEMT selected from the first embodiment and the modified example thereof is applied to the switching element 51.

In the PFC circuit 50, the drain electrode of the switching element 51 is connected with the anode terminal of the diode 52 and one terminal of the choke coil 53. The source electrode of the switching element 51 is connected with one terminal of the capacitor 54 and one terminal of the capacitor 55. The other terminal of the capacitor 54 is connected with the other terminal of the choke coil 53. The other terminal of the capacitor 55 is connected with the cathode terminal of the diode 52. An AC 57 is connected between both terminals of the capacitor 54 through the diode bridge 56. A DC power supply (DC) is connected between both of the terminals of the capacitor 55.

In the present embodiment, the AlGaN/GaN-HEMT is applied to the PFC circuit 50, which enables an adequate normally-off operation, alleviates the convergence of an electric field toward the gate electrode to further enhance the withstand voltage, besides, has a parasitic capacity Cgd between the gate electrode and the drain electrode greatly reduced, and can obtain high transistor characteristics. Thereby, a highly reliable PFC circuit 50 is realized.

Third Embodiment

In the present embodiment, a power-supply unit is disclosed which is provided with an AlGaN/GaN-HEMT selected from the first embodiment and the modified example thereof.

Figure 10:
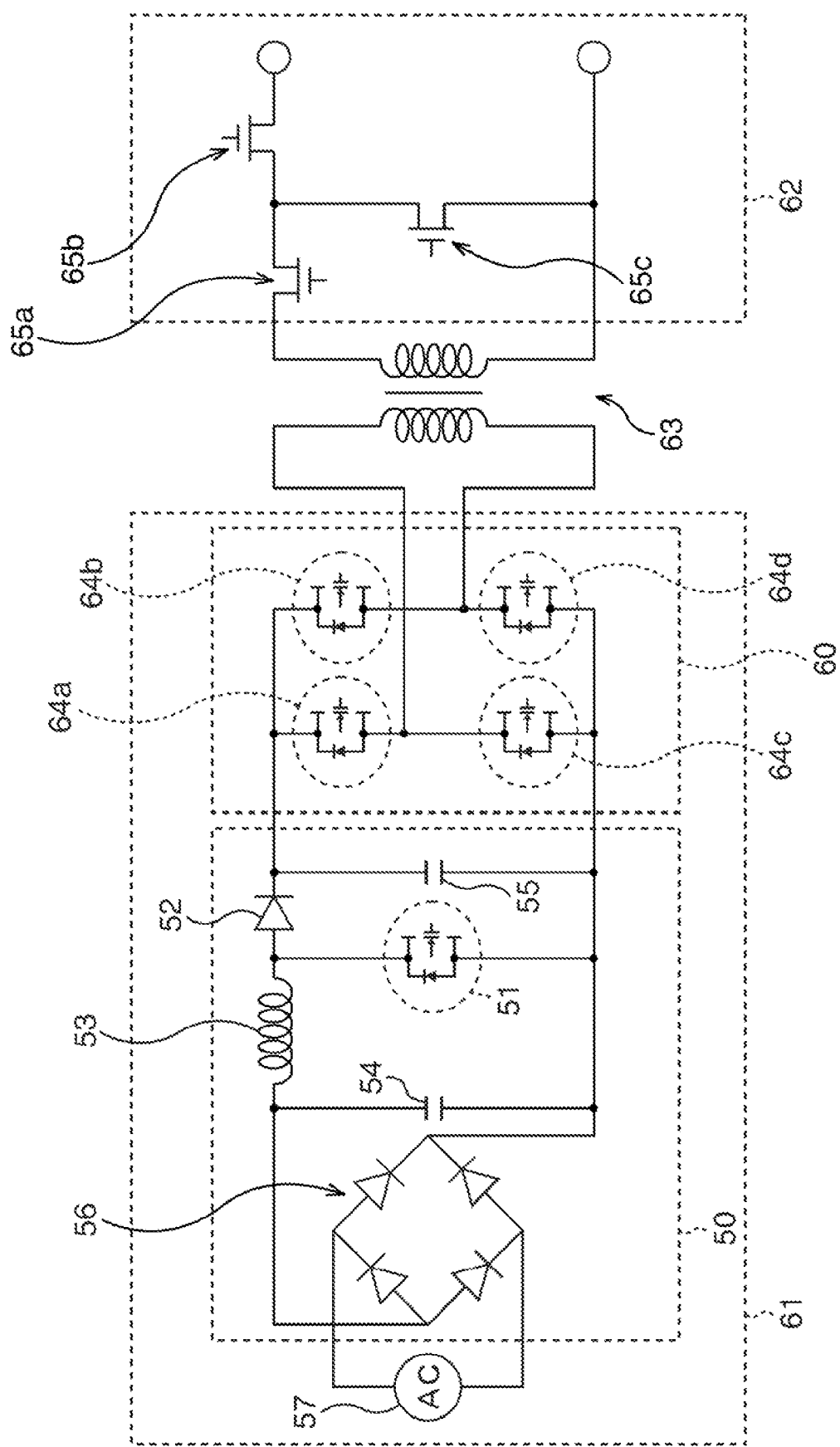
FIG. 10 is a connection wiring diagram illustrating a schematic structure of an power-supply unit according to the third embodiment.

FIG. 10 is a connection wiring diagram illustrating a schematic structure of the power-supply unit according to the third embodiment.

The power-supply unit according to the present embodiment is constituted by a high-voltage circuit 61 in a primary side, a low-voltage circuit 62 in a secondary side, and a transformer 63 arranged between the circuit 61 in the primary side and the circuit 62 in the secondary side.

The circuit 61 in the primary side has the PFC circuit 50 according to the second embodiment, and an inverter circuit connected to both terminals of the capacitor 55 in the PFC circuit 50, for instance, a full-bridge inverter circuit 60. The full-bridge inverter circuit 60 is constituted by a plurality (here, four) of switching elements 64a, 64b, 64c and 64d.

The circuit 62 in the secondary side is constituted by a plurality (here, three) of switching elements 65a, 65b and 65c.

In the present embodiment, the switching elements 64a, 64b, 64c and 64d of the full-bridge inverter circuit 60 shall be an AlGaN/GaN-HEMT selected from the first embodiment and the modified example thereof, similarly to the switching element 51 in the PFC circuit 50 constituting the circuit 61 in the primary side. On the other hand, the switching elements 65a, 65b and 65c in the circuit 62 in the secondary side shall be an usual MIS-FET using silicon.

In the AlGaN/GaN-HEMT selected from the first embodiment and the modified example thereof, the field plate electrode is adopted which comes in Schottky contact with the structure of the stacked compound semiconductors, as having been described in the first embodiment. Thereby, a function of a protection diode is imparted to the AlGaN/GaN-HEMT, in which the field plate electrode works as anode and the drain electrode works as a cathode. In the present embodiment, the AlGaN/GaN-HEMT is applied to the switching element 51 in the PFC circuit 50, and the switching elements 64a, 64b, 64c and 64d in the full-bridge inverter circuit 60. Because of this, in the circuit 61 in the primary side, the fracture of the switching elements 51, 64a, 64b, 64c and 64d is suppressed by the rectifying action of the protection diode, even when a surge voltage has occurred in the switching elements 51, 64a, 64b, 64c and 64d. Thus, high avalanche resistance is secured, which contributes to the stabilization of the device operation.

In the present embodiment, a high-voltage resistant AlGaN/GaN-HEMT is applied to a circuit 61 in a primary side of a high-voltage circuit, which enables an adequate normally-off operation, alleviates the convergence of an electric field toward the gate electrode to further enhance the withstand voltage, besides, has the high avalanche resistance, does not need to have an external diode connected thereto, and can obtain a surely stable operation. Thereby, a power-supply unit with high reliability and a large electric power is realized.

Fourth Embodiment

In the present embodiment, a high-frequency amplifier will be disclosed which is provided with an AlGaN/GaN-HEMT selected from the first embodiment and the modified example thereof.

Figure 11:
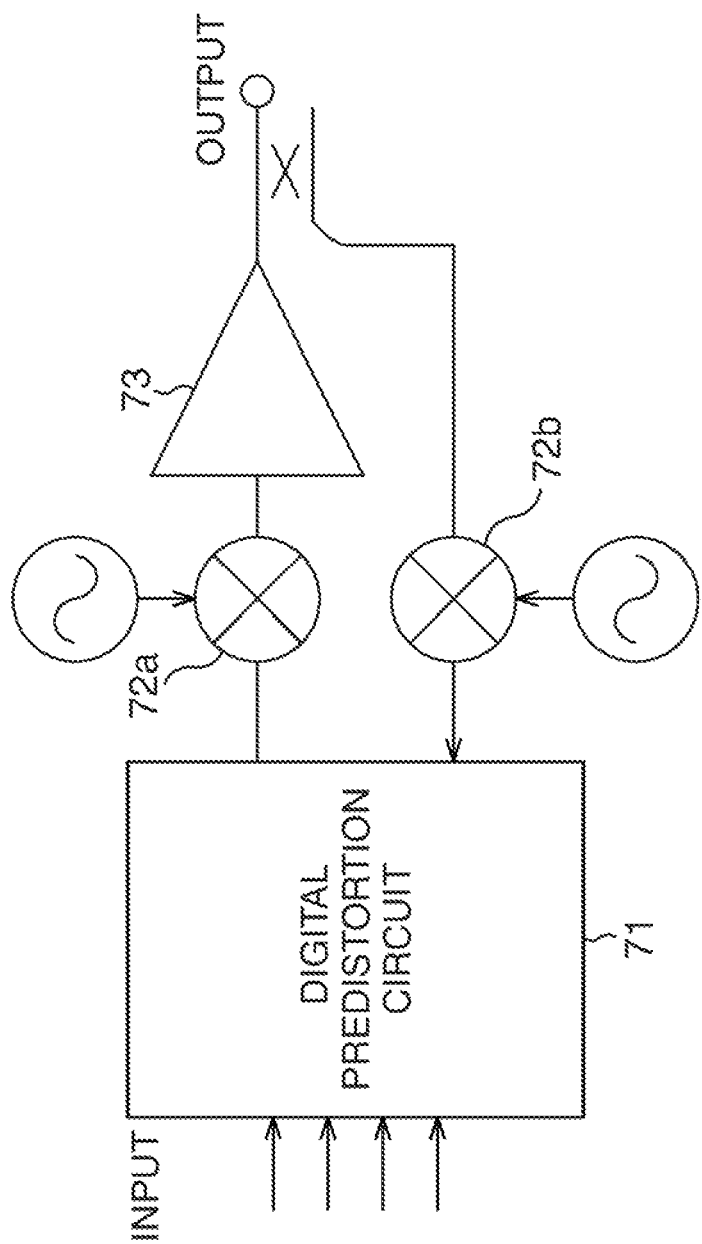
FIG. 11 is a connection wiring diagram illustrating a schematic structure of a high-frequency amplifier according to the fourth embodiment.

FIG. 11 is a connection wiring diagram illustrating a schematic structure of the high-frequency amplifier according to the fourth embodiment.

The high-frequency amplifier according to the present embodiment is constituted by a digital predistortion circuit 71, mixers 72a and 72b, and a power amplifier 73.

The digital predistortion circuit 71 compensates a non-linear distortion of an input signal. The mixer 72a mixes an input signal of which the non-linear distortion has been compensated, with an AC signal. The power amplifier 73 is a device for amplifying the input signal which has been mixed with the AC signal, and has the AlGaN/GaN-HEMT selected from the first embodiment and the modified example thereof. Incidentally, the high-frequency amplifier in FIG. 11 is structured so as to be capable of sending a mixture signal of a signal in the output side and the AC signal mixed by the mixer 72b to the digital predistortion circuit 71, for instance, by switching a switch.

In the present embodiment, the AlGaN/GaN-HEMT is applied to the high-frequency amplifier, which enables an adequate normally-off operation, alleviates the convergence of an electric field toward the gate electrode to further enhance the withstand voltage, besides, has a parasitic capacity Cgd between the gate electrode and the drain electrode greatly reduced, and can obtain high transistor characteristics. Thereby, a highly-reliable and high-voltage resistant high-frequency amplifier is realized.

Other Embodiments

In the first embodiment and the modified example, and in the second to fourth embodiments, an AlGaN/GaN-HEMT has been exemplified as a compound semiconductor device. Other than the AlGaN/GaN-HEMT, the following HEMTs also can be applied to the compound semiconductor device.

Example 1 of Other HEMTs

In the present example, an InAlN/GaN-HEMT is disclosed as a compound semiconductor device.

InAlN and GaN are compound semiconductors which can have close lattice constants depending on the compositions. In this case, in the above described first embodiment and the modified example, and in the second to fourth embodiments, an electron transit layer is formed from i-GaN, an intermediate layer from i-InAlN, an electron supply layer from n-InAlN, and a cap layer from n-GaN. For information, in this case, piezo polarization is not almost generated, and the two-dimensional electron gas is mainly generated by a spontaneous polarization of InAlN.

According to the present example, a highly-reliable and high-voltage resistant InAlN/GaN-HEMT is realized which enables an adequate normally-off operation, alleviates the convergence of an electric field toward the gate electrode to further enhance the withstand voltage, besides, has the high avalanche resistance, does not need to have an external diode connected thereto, and can obtain a surely stable operation, similarly to the above described AlGaN/GaN-HEMT.

Other Example 2 of HEMT

In the present example, an InAlGaN/GaN-HEMT is disclosed as a compound semiconductor device.

GaN and InAlGaN are compound semiconductors in which the latter can have a smaller lattice constant than that of the former depending on the compositions. In this case, in the above described first embodiment and the modified example, and in the second to fourth embodiments, an electron transit layer is formed from i-GaN, an intermediate layer from i-InAlGaN, an electron supply layer from n-InAlGaN, and a cap layer from n-GaN.

According to the present example, a highly-reliable and high-voltage resistant InAlGaN/GaN-HEMT is realized which enables an adequate normally-off operation, alleviates the convergence of an electric field toward the gate electrode to further enhance the withstand voltage, besides, has the high avalanche resistance, does not need to have an external diode connected thereto, and can obtain a surely stable operation, similarly to the above described AlGaN/GaN-HEMT.

The above described embodiments realize a highly-reliable and high-voltage resistant compound semiconductor device which enables an adequate normally-off operation, alleviates the convergence of an electric field toward the gate electrode to further enhance the withstand voltage, besides, has the high avalanche resistance, does not need to have the external diode connected thereto, for instance, when being applied to the inverter circuit, and can obtain the surely stable operation.

A compound semiconductor device, a method for manufacturing the same, and embodiments of a power-supply unit and a high-frequency amplifier are collectively described below as claims.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:
   a structure of stacked compound semiconductors, in which a first recess and a second recess are formed;
   a gate electrode formed in the first recess through a gate insulation film; and
   a field plate electrode which is formed in the second recess and comes in Schottky contact with the structure of the stacked compound semiconductors.

2. The compound semiconductor device according to claim 1, wherein the second recess is formed so as to be shallower than the first recess.

3. The compound semiconductor device according to claim 1, wherein
   the structure of the stacked compound semiconductors has a cap layer on the top layer, and
   the second recess is formed only in the cap layer.

4. The compound semiconductor device according to claim 3, wherein
   the cap layer is formed of a first layer, a second layer and a third layer which are sequentially stacked,
   the first layer and the third layer have a narrower band gap than that of a compound semiconductor layer under the cap layer in the structure of the stacked compound semiconductors, and the second layer has a wider band gap than that of the compound semiconductor layer.

5. The compound semiconductor device according to claim 4, wherein the second recess is formed so that the second layer is exposed to the outside at the bottom face.

6. The compound semiconductor device according to claim 1, further comprising:
a source electrode and a drain electrode formed on the structure of the stacked compound semiconductors so as to be adjacent to the gate electrode, wherein
the field plate electrode is electrically connected with the source electrode.

7. A method for manufacturing a compound semiconductor device comprising:
forming a first recess in a surface layer in a structure of stacked compound semiconductors;
forming a gate insulation film in the first recess;
forming a second recess in a surface layer of the structure of the stacked compound semiconductors;
forming a gate electrode in the first recess through the gate insulation film; and
forming a field plate electrode which comes in Schottky contact with the structure of the stacked compound semiconductors in the second recess.

8. The method for manufacturing the compound semiconductor device according to claim 7, wherein the second recess is formed so as to be shallower than the first recess.

9. The method for manufacturing the compound semiconductor device according to claim 7, wherein the gate electrode and the field plate electrode are formed in the same step.

10. The method for manufacturing the compound semiconductor device according to claim 7, wherein
the structure of the stacked compound semiconductors has a cap layer on the top layer, and
the second recess is formed only in the cap layer.

11. The method for manufacturing the compound semiconductor device according to claim 10, wherein
the cap layer is formed of a first layer, a second layer and a third layer which are sequentially stacked,
the first layer and the third layer have a narrower band gap than that of a compound semiconductor layer under the cap layer in the structure of the stacked compound semiconductors, and the second layer has a wider band gap than that of the compound semiconductor layer.

12. The method for manufacturing the compound semiconductor device according to claim 11, wherein the second recess is formed so that the second layer is exposed to the outside at the bottom face.

13. The method for manufacturing the compound semiconductor device according to claim 7, further comprising:
forming a source electrode and a drain electrode on the structure of the stacked compound semiconductors so as to be adjacent to the gate electrode; and
electrically connecting the field plate electrode with the source electrode.

14. A power-supply unit comprising:
a transformer, and a high-voltage circuit and a low-voltage circuit which sandwich the transformer,
the high-voltage circuit comprising a transistor,
the transistor comprising:
a structure of stacked compound semiconductors, in which a first recess and a second recess are formed;
a gate electrode formed in the first recess through a gate insulation film; and
a field plate electrode which is formed in the second recess and comes in Schottky contact with the structure of the stacked compound semiconductors.

15. The power-supply unit according to claim 14, wherein
the high-voltage circuit comprises a PFC circuit, and
a first switching element provided in the PFC circuit is the transistor.

16. The power-supply unit according to claim 15, wherein
the high-voltage circuit further comprises an inverter circuit connected to the PFC circuit, and
a second switching element provided in the inverter circuit is the transistor.

17. The power-supply unit according to claim 14, wherein the transistor has the second recess which is formed so as to be shallower than the first recess.

18. A high-frequency amplifier for amplifying input high-frequency voltage and outputting the amplified high-frequency voltage,
the high-frequency amplifier comprising a transistor,
the transistor comprising:
a structure of stacked compound semiconductors, in which a first recess and a second recess are formed;
a gate electrode formed in the first recess through a gate insulation film; and
a field plate electrode which is formed in the second recess and comes in Schottky contact with the structure of the stacked compound semiconductors.

* * * * *